(12) United States Patent
Xie et al.

(10) Patent No.: US 9,711,503 B2
(45) Date of Patent: Jul. 18, 2017

(54) GATE STRUCTURES WITH PROTECTED END SURFACES TO ELIMINATE OR REDUCE UNWANTED EPI MATERIAL GROWTH

(71) Applicants: GLOBALFOUNDRIES Inc., Grand Cayman (KY); International Business Machines Corporation, Armonk, NY (US)

(72) Inventors: Ruilong Xie, Niskayuna, NY (US); Shom Ponoth, Gaithersburg, MD (US); Juntao Li, Cohoes, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 137 days.

(21) Appl. No.: 14/731,569

(22) Filed: Jun. 5, 2015

(65) Prior Publication Data
US 2015/0270262 A1    Sep. 24, 2015

Related U.S. Application Data

(62) Division of application No. 14/079,043, filed on Nov. 13, 2013, now Pat. No. 9,105,617.

(51) Int. Cl.
| | | |
|---|---|---|
| H01L 27/088 | (2006.01) | |
| H01L 29/423 | (2006.01) | |
| H01L 29/49 | (2006.01) | |
| H01L 27/085 | (2006.01) | |
| H01L 21/8234 | (2006.01) | |
| H01L 21/8238 | (2006.01) | |
| H01L 27/02 | (2006.01) | |
| H01L 27/092 | (2006.01) | |
| H01L 29/66 | (2006.01) | |
| H01L 29/06 | (2006.01) | |

(52) U.S. Cl.
CPC .... *H01L 27/088* (2013.01); *H01L 21/823437* (2013.01); *H01L 21/823828* (2013.01); *H01L 27/0207* (2013.01); *H01L 27/085* (2013.01); *H01L 27/092* (2013.01); *H01L 29/0692* (2013.01); *H01L 29/42372* (2013.01); *H01L 29/4916* (2013.01); *H01L 29/66628* (2013.01)

(58) Field of Classification Search
None
See application file for complete search history.

(56) References Cited

U.S. PATENT DOCUMENTS

| | | | |
|---|---|---|---|
| 7,517,737 B2 | 4/2009 | Li et al. | |
| 9,508,727 B2 * | 11/2016 | Park | H01L 27/1104 |
| 2009/0108313 A1 | 4/2009 | Doyle et al. | |

(Continued)

*Primary Examiner* — Robert Carpenter
(74) *Attorney, Agent, or Firm* — Amerson Law Firm, PLLC

(57) ABSTRACT

One method disclosed herein includes, among other things, forming a line-end protection layer in an opening on an entirety of each opposing, spaced-apart first and second end face surfaces of first and second spaced-apart gate electrode structures, respectively, and forming a sidewall spacer adjacent opposing sidewall surfaces of each of the gate electrode structures but not adjacent the opposing first and second end face surfaces having the line-end protection layer positioned thereon.

15 Claims, 9 Drawing Sheets

(56) References Cited

U.S. PATENT DOCUMENTS

2011/0303980 A1* 12/2011 Sultan ................... H01L 21/84
    257/347
2013/0062708 A1* 3/2013 Zhong ............... H01L 29/66545
    257/401

* cited by examiner

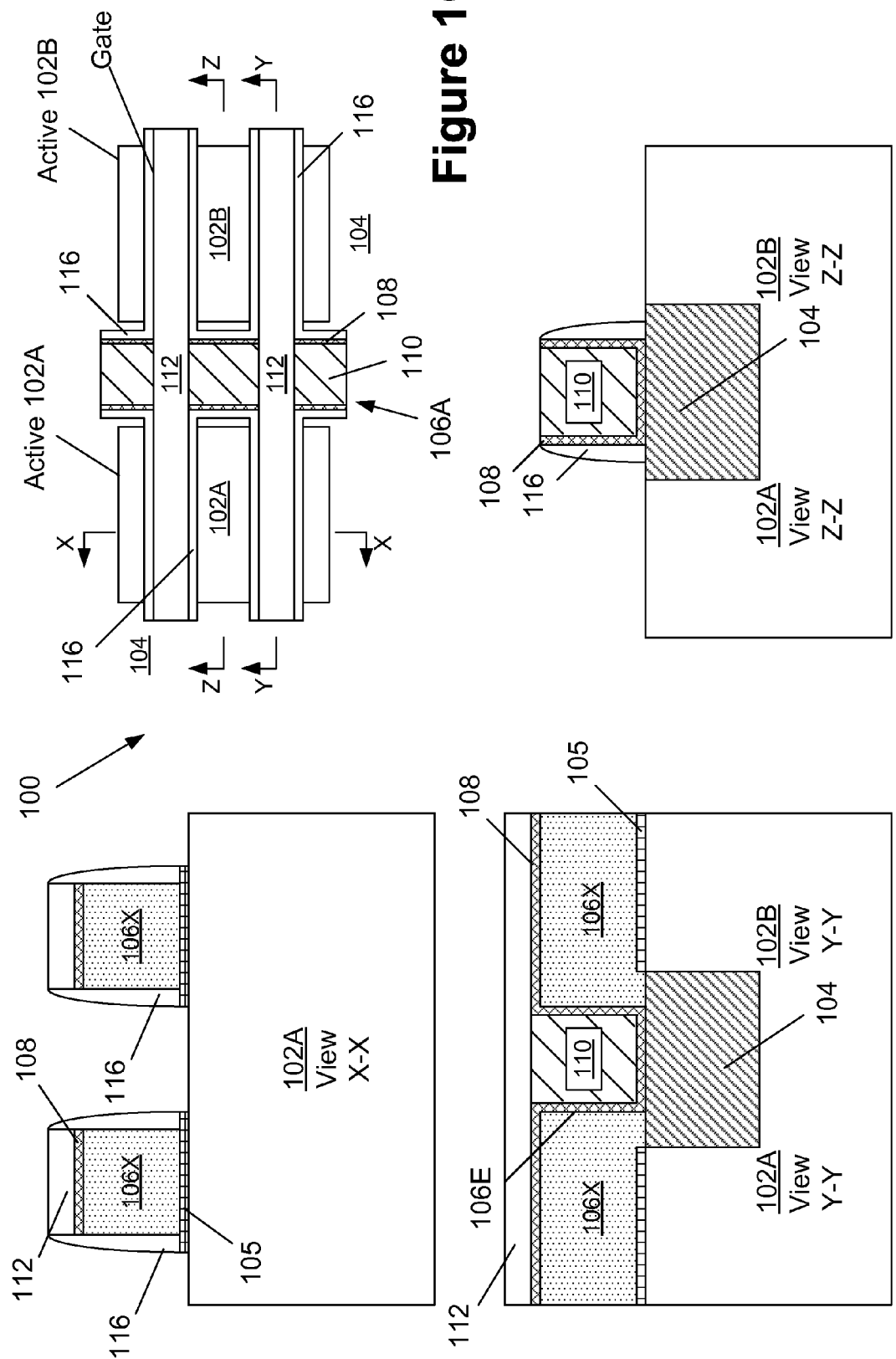

GATE STRUCTURES WITH PROTECTED END SURFACES TO ELIMINATE OR REDUCE UNWANTED EPI MATERIAL GROWTH

CROSS-REFERENCE TO RELATED APPLICATION

This is a divisional of co-pending application Ser. No. 14/079,043, filed Nov. 13, 2013.

BACKGROUND OF THE INVENTION

1. Field of the Invention

The present disclosure generally relates to the fabrication of integrated circuits, and, more particularly, to various methods and structures for eliminating or at least reducing line end epi material growth on gate structures of semiconductor devices.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped source and drain regions that are formed in a semiconducting substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epi semiconductor material in recesses formed in the source/drain regions of the planar FET device. In some cases, the epi material may be formed in the source/drain regions without forming any recesses in the substrate for a planar FET device. The gate structures for such planar FET devices may be manufactured using so-called "gate-first" or "replacement gate" (gate-last) manufacturing techniques.

Immense progress has been made over recent decades with respect to increased performance and reduced feature sizes of circuit elements, such as transistors. However, the ongoing demand for enhanced functionality of electronic devices has forced semiconductor manufacturers to steadily reduce the dimensions of the circuit elements and to increase the operating speed of the circuit elements. The continuing scaling of feature sizes, however, involves great efforts in redesigning the structure of the devices, process techniques and developing new process strategies and tools so as to comply with new design rules. More specifically, to improve the operating speed of FETs, and to increase the density of FETs on an integrated circuit device, device designers have greatly reduced the physical size of FETs over the past decades. That is, the channel length of planar FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel region of a planar FET device from being adversely affected by the electrical potential of the drain region. This is sometimes referred to as a so-called short channel effect, wherein the characteristic of the planar FET as an active switch is degraded.

As noted above, in contrast to a planar FET, which has a substantially planar structure, a so-called FinFET device has a three-dimensional (3D) structure. The basic features of a FinFET device include one or more vertically oriented fins that span the channel region of the device and the source/drain regions, a gate structure positioned around the exposed portions of the fins in the channel region of the device, a gate cap layer positioned above the gate electrode of the gate structure, and sidewall spacers positioned adjacent the gate structure and the gate cap layer. The sidewall spacers and gate cap layer protect the gate structure during subsequent processing operations. The gate structure may be comprised of a layer of insulating material, e.g., a layer of high-k insulating material or silicon dioxide, and one or more conductive material layers (e.g., metal and/or polysilicon) that serve as the gate electrode for the device. As noted above, the fins have a three-dimensional configuration: a height, a width and an axial length. The axial length corresponds to the direction of current travel in the device when it is operational. The portions of the fins covered by the gate structure are the channel regions of the FinFET device. In a conventional process flow, the portions of the fins that are positioned outside of the spacers, i.e., in the source/drain regions of the device, may be increased in size or even merged together by performing one or more epitaxial growth processes to form epi semiconductor material on the portions of the fins in the source/drain regions of the FinFET device. The process of increasing the size of or merging the fins in the source/drain regions of the FinFET device is performed for various reasons, e.g., to reduce the resistance of source/drain regions and/or to make it easier to establish electrical contact to the source/drain regions, etc. Even if an epi "merge" process is not performed, an epi growth process will typically be performed on the fins in the source/drain regions of the device to increase their physical size. In a FinFET device, the gate structure may enclose both sides and the upper surface of all or a portion of the fins to form a tri-gate structure so as to result in a channel having a three-dimensional structure instead of a planar structure. In some cases, an insulating cap layer, e.g., silicon nitride, is positioned at the top of the fins and the FinFET device only has a dual-gate structure (fin sidewalls only).

Thus, unlike a planar FET, in a FinFET device, a channel is formed perpendicular to the upper surface of the semiconducting substrate, thereby reducing the physical size of the FinFET device. Also, in a FinFET device, the junction capacitance at the drain region of the device is greatly reduced, which tends to significantly reduce short channel effects. When an appropriate voltage is applied to the gate electrode of a FinFET device, the surfaces (and the inner portion near the surface) of the fins, i.e., the vertically oriented sidewalls and the top upper surface of the fin (for a tri-gate device), form a surface inversion layer or a volume inversion layer that contributes to current conduction. In a FinFET device (tri-gate), the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar FET devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior structure as compared to that of a planar FET, especially in the 20 nm CMOS technology node and beyond. The gate structures for such FinFET devices may also be manufactured using so-called "gate-first" or "replacement gate" (gate-last) manufacturing techniques.

Over recent years, due to the reduced dimensions of the transistor devices, the operating speed of the circuit components has been increased with every new device generation, and the "packing density," i.e., the number of transistor devices per unit area, in such products has also increased during that time. As a result of such increased packing densities, the physical space between adjacent devices has become very small, which can lead to some problems in manufacturing.

In general, one commonly employed technique for forming gate structures for either planar or 3D devices involves forming a line-type gate electrode structure above a layer of insulating material that is formed above an active region defined in a semiconductor substrate. Typically, the line-type gate electrode structures are formed by depositing or thermally growing a layer of gate insulation material, e.g., silicon dioxide, on the spaced-apart active regions that are separated by isolation material, blanket-depositing a layer of gate electrode material, e.g., polysilicon or amorphous silicon, on the gate insulation layer and blanket-depositing a gate cap material layer on the layer of gate electrode material. Thereafter, gate electrodes for the devices are typically formed by patterning at least the gate cap layer and the layer of gate electrode material to define long parallel line-type structures, i.e., gate electrode structures that extend across multiple spaced-apart active regions and the isolation regions formed in the substrate between such spaced-apart active regions. These long, line-type gate electrode structures are initially patterned so as to have the desired critical dimension, i.e., the dimension of gate electrode corresponding to the "gate length" (or direction of current travel) of the finished device. At some point later in the process flow, these long, line-type gate electrode structures are subsequently "cut" by performing an etching process to define the gate electrodes having the desired length in the "gate-width" direction of the transistor device. This results in substantially rectangular shaped gate structures (when viewed from above) having the desired dimensions in the gate-length and gate width directions. After the gate electrodes are patterned, a sidewall spacer is typically formed around the perimeter of the substantially rectangular shaped gate structure, i.e., the spacer if formed adjacent all four side sidewalls (two sidewalls and two end surfaces) of each of the patterned gate electrodes. In some cases, a thin liner layer may be formed on the gate structure prior to forming the sidewall spacer. The sidewall spacer, in combination with the gate cap layer, function to protect the gate electrode structure in subsequent processing operations. In the case where transistor devices are manufactured using so-called gate-first processing techniques, the gate structures (gate electrode plus the gate insulation layer) formed as described above are final gate structures for the device. In the situation where transistor devices are manufactured using so-called gate-last processing techniques, the gate structures (gate electrode and gate insulation layer) formed as described above are sacrificial in nature and will be subsequently removed (after several process operations are performed) and replaced with a final gate structure for the device. In the gate-last processing technique, the final gate structure typically includes one or more layers of high-k (k greater than 10) insulating material and one or more layers of metal that constitute at least part of the conductive gate electrode of the final gate structure.

Unfortunately, as device dimensions have decreased and packing densities have increased, it is more likely that, when epi semiconductor material is formed in the source/drain regions of the planar or 3D transistor device, some of the epi material may undesirably form on the end surfaces of the polysilicon/amorphous silicon gate electrode. This may occur for several reasons. As noted above, after the gate structures are patterned, a sidewall spacer is formed around all four sides of the gate structure so as to, along with the gate cap layer, encapsulate and protect the gate electrode during subsequent processing operations. As packing densities have increased, the end-to-end spacing between two different gate electrode structures formed above two different active regions has decreased, thereby limiting the physical size, i.e., the width, of the protective sidewall spacers. Additionally, as the pitch between adjacent gate structures has decreased, the width of the protective sidewall spacers must also be decreased. With respect to forming a sidewall spacer on a FinFET device, the duration of the etching process performed to form the spacer is typically increased to insure that the layer of spacer material is completely cleared from the surfaces of the fins in the source/drain regions of the FinFET device. This over-etching also tends to reduce the width of the protective spacer. All of these factors and others tend to result in an undesirable thinning of the spacer, particularly at the corner of the gate electrode (the intersection between the side surfaces and the end surfaces of the gate electrode). It is not uncommon that, due to these factors and others, some portion of the polysilicon or amorphous silicon gate electrode material will be exposed at the time epi semiconductor material is formed in the source/drain regions of a planar or FinFET device. As a result, epi semiconductor material will undesirably form on the exposed portions of the gate electrode layer.

The extent and amount of undesirable epi semiconductor material formation will vary depending upon the particular application and the quality of the manufacturing processes used to manufacture the device. In a worst case scenario, this undesirable epi semiconductor material may form around the entire end surface of a particular gate electrode so as to effectively from a conductive "bridge" between one or both of the source/drain regions and the gate electrode. In another example, such undesirable epi semiconductor material may span the space between the opposing end surfaces of two spaced-apart gate electrode structures, wherein the epi material may form on one or both of the spaced-apart gate structures. As a result of such undesirable and unpredictable epi formation, the resulting semiconductor devices and the integrated circuits including such devices may complete fail or operate at less than acceptable performance levels. One solution to remedy the potential formation of such undesirable epi material would be to simply make the end-to-end spacing between two adjacent gate structures and the pitch between such adjacent gate structures large enough so extra thick spacers could be formed around the gate structures. However, such a "solution" would lead to reduced packing densities, which is counter to the ongoing trend in the industry now and for the foreseeable future.

The present disclosure is directed to various methods and structures for eliminating or at least reducing line end epi material growth on gate structures of semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods and structures for eliminating or at least reducing line end epi material growth on gate structures of semiconductor devices. One method disclosed includes, among other things, forming a layer of gate electrode material above first and second spaced-apart active regions of a semiconductor substrate that are separated by an isolation region formed in a substrate, performing at least one first etching process on the layer of gate electrode material so as to define an opening positioned above the isolation region, wherein the opening in the layer of gate electrode material defines opposing, spaced-apart first and second end face surfaces of first and second spaced-apart gate electrode structures, respectively, forming a line-end protection layer in the opening on at least an entirety of each of the opposing first and second end face surfaces, performing at least one second etching process on the patterned layer of gate electrode material, wherein the at least one second etching process defines opposing sidewall surfaces for each of the first and second spaced-apart gate electrode structures and, with the line-end protection layer in contact with the opposing first and second end face surfaces, forming a sidewall spacer adjacent at least the opposing sidewall surfaces of each of the first and second spaced-apart gate electrode structures but not adjacent the opposing first and second end face surfaces having the line-end protection layer positioned thereon.

Another illustrative method disclosed herein includes, among other things, forming a layer of gate electrode material above first and second spaced-apart active regions of a semiconductor substrate that are separated by an isolation region formed in the substrate, performing at least one first etching process to pattern the layer of gate electrode material so as to define an opening positioned above the isolation region, wherein the opening in the layer of gate electrode material defines opposing, spaced-apart first and second end face surfaces of first and second spaced-apart gate electrode structures, respectively, and forming a line-end protection layer in the opening an on an entirety of each of the opposing first and second end face surfaces and on an entire upper surface of the patterned layer of gate electrode material. In this example, the method further includes forming an insulating material on the line-end protection layer in the opening, after forming the insulating material in the opening, forming a patterned gate cap protection layer above the line-end protection layer and the patterned layer of gate electrode material, performing at least one second etching process through the patterned gate cap protection layer on the line-end protection layer and the patterned layer of gate electrode material, wherein the at least one second etching process defines opposing sidewall surfaces for each of the first and second spaced-apart gate electrode structures, and, with the line-end protection layer in contact with the opposing first and second end face surfaces, forming a sidewall spacer adjacent at least the opposing sidewall surfaces of each of the first and second spaced-apart gate electrode structures but not adjacent the opposing first and second end face surfaces having the line-end protection layer positioned thereon.

One illustrative device disclosed herein includes, among other things, first and second spaced-apart active regions of a semiconductor substrate, first and second spaced-apart gate electrode structures positioned above the first and second active regions, respectively, wherein the first and second gate electrode structures comprise opposing first and second end face surfaces, respectively, a line-end protection layer positioned on and in contact with an entirety of the opposing first and second end face surfaces, and a sidewall spacer positioned adjacent opposing sidewall surfaces of each of the first and second spaced-apart gate electrode structures but not adjacent the opposing first and second end face surfaces having the line-end protection layer positioned thereon.

BRIEF DESCRIPTION OF THE DRAWINGS

The disclosure may be understood by reference to the following description taken in conjunction with the accompanying drawings, in which like reference numerals identify like elements, and in which:

FIGS. 1A-1I depict various illustrative methods and structures for eliminating or at least reducing line end epi material growth on gate structures of semiconductor devices.

Figure 1A:
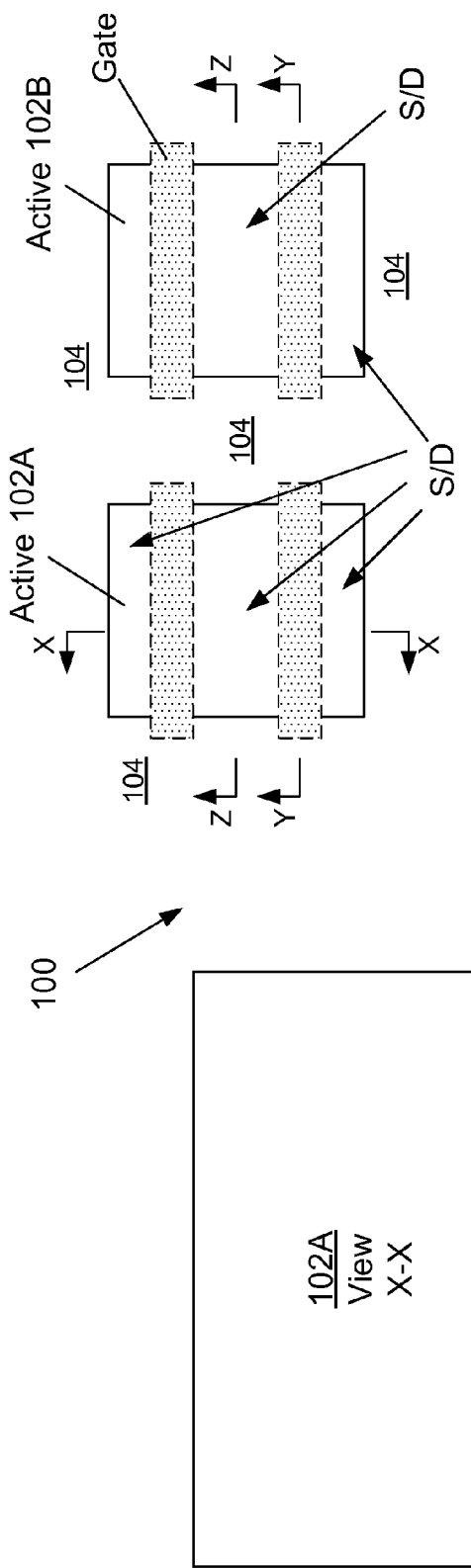
Figure 1A:
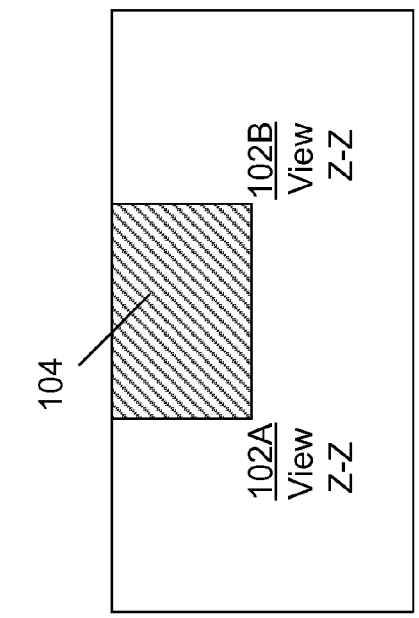
Figure 1A:
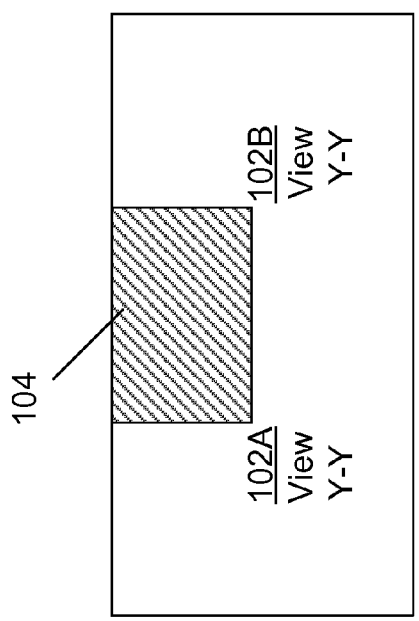

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods and structures for eliminating or at least reducing line end epi material growth on gate structures of semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

FIGS. 1A-1I depict various illustrative methods and structures for eliminating or at least reducing line end epi material growth on gate structures of semiconductor devices. In general, the drawings contain a plan view and various cross-sectional views that are taken where indicated in the plan view. The plan view in FIG. 1A depicts two spaced-apart active regions 102A, 102B that are separated by isolation material 104, and four illustrative gate structures (depicted in dashed lines in FIG. 1A since they are not yet formed at this point in the process flow). With continuing reference to the plan view in FIG. 1A, the view "X-X" is a cross-sectional view taken along the "gate-length" or current transport direction for the finished transistor devices formed above the active region 102A, i.e., a cross-sectional view through the gate structures. The view "Y-Y" is a cross-sectional view that is taken through the long axis of the gate structures formed above both of the active regions 102A, 102B, i.e., a cross-sectional view through the gate structures in the gate-width direction of the transistor devices. The view "Z-Z" is a cross-sectional view that is taken through what will become the source/drain (S/D) regions of the devices that are formed above both of the active regions 102A, 102B.

As will be appreciated by those skilled in the art after a complete reading of the present application, the methods and structures disclosed herein may be used when forming either planar or 3D transistor devices, and the gate structures for such devices may be formed using either gate-first or replacement gate techniques. The transistor devices that are depicted in the attached drawings may be either NMOS or PMOS devices. Additionally, various doped regions, e.g., source/drain regions, halo implant regions, well regions and the like, are also not depicted in the attached drawings. The illustrative integrated circuit product 100 depicted in the drawings is formed above an illustrative substrate 102 that may have a variety of configurations, such as the depicted bulk silicon configuration. The substrate 102 may be made of silicon or it may be made of materials other than silicon. Thus, the terms "substrate" or "semiconductor substrate" should be understood to cover all semiconducting materials and all forms of such materials.

FIG. 1A depicts the product 100 at a point in fabrication wherein the spaced-apart active regions 102A, 102B were defined in the substrate 102 by the formation of isolation structures 104. The isolation structures 104 may be formed using well-known techniques. The overall size of the active regions 102A, 102B may vary depending upon the particular application.

Figure 1B:
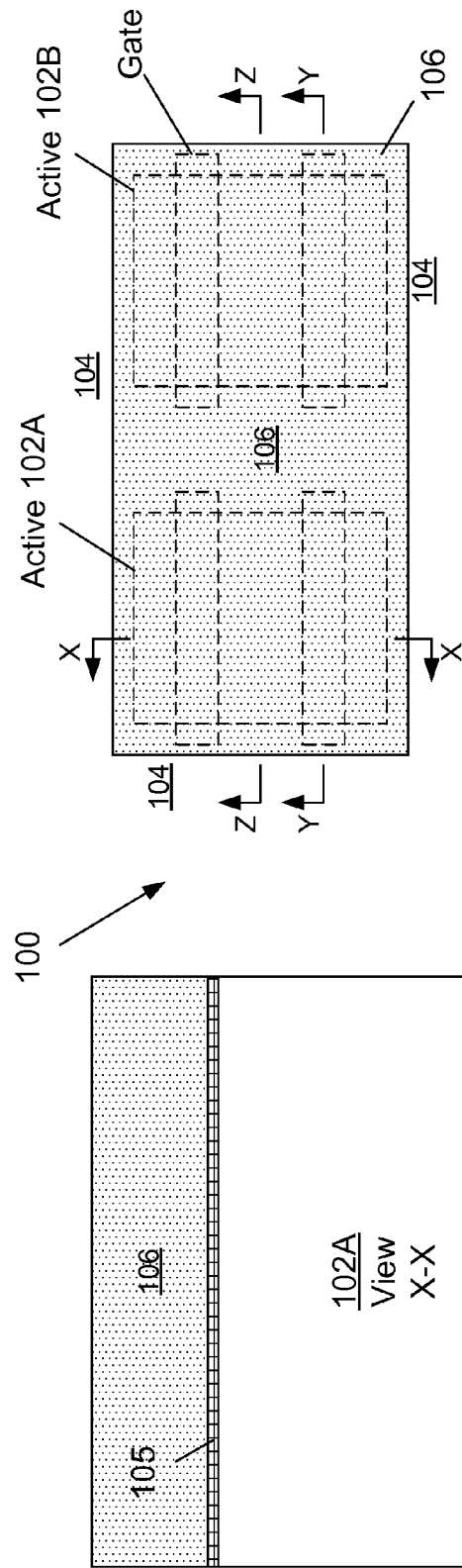
Figure 1B:
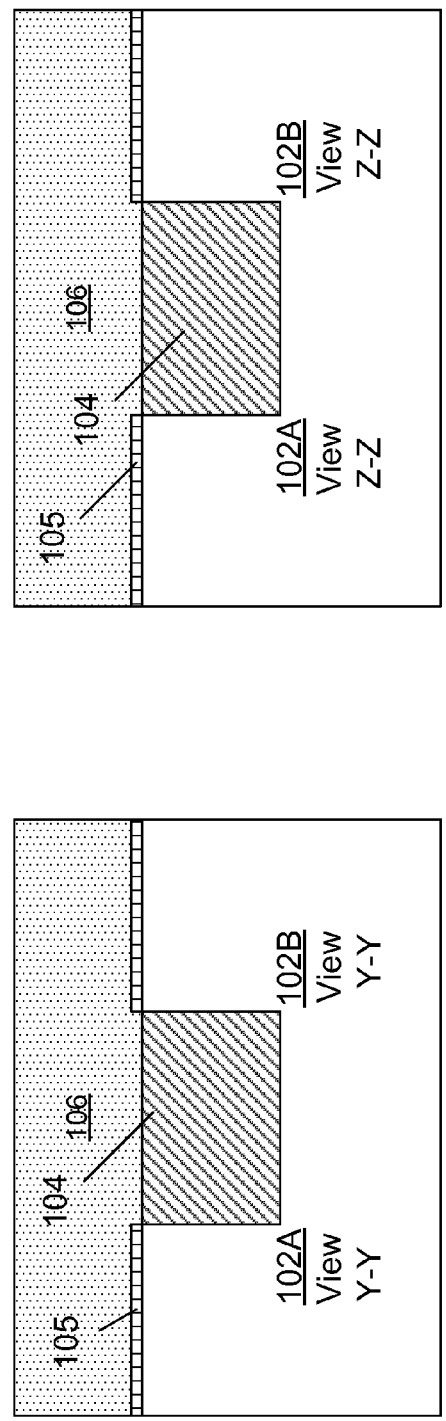

FIG. 1B depicts the product 100 after a layer of gate insulation material 105 and a layer of gate electrode material 106 have been formed on the product 100. In the plan view in FIG. 1B, the generally rectangular-shaped gate structures for the devices are depicted in dashed lines as they have not yet been formed. Additionally, the outlines of the active regions 102A, 102B are depicted in dashed lines for reference purposes. The gate insulation material 105 and the gate electrode material 106 should be understood to be representative in nature as they may be comprised of any of a variety of different materials that may be formed using a variety of different techniques. For example, the gate insulation material 105 may be comprised of a variety of different materials, such as, for example, silicon dioxide, etc., while the gate electrode material 106 may be a material such as polysilicon or amorphous silicon, etc. In one illustrative embodiment, an oxidation process may be performed to form a gate insulation material 105 comprised of silicon dioxide on the spaced-apart active regions 102A, 102B. If desired, the gate insulation material 105 may also be formed by performing any of a variety of known deposition processes. Thereafter, gate electrode material 106 may be blanket-deposited across the entire substrate 102 and on the previously formed gate insulation material 105. The layers of material depicted in FIG. 1B, as well as the layers of material described below, may be formed by any of a variety of different known techniques, e.g., a chemical vapor deposition (CVD) process, an atomic layer deposition (ALD) process, a thermal growth process, spin-coating techniques, etc. As noted previously, the final gate structures for the transistor devices disclosed herein may be formed using either gate-first or gate-last techniques. For purposes of disclosing the present subject matter, no distinction will be made as it relates whether the gate structures (comprised of the gate insulation material 105 and gate electrode material 106) are final or sacrificial in nature expect where such distinction is needed to address or explain a particular point. In the case where transistor devices are manufactured using so-called gate-first processing techniques, the gate structures (gate electrode 106 plus the gate insulation layer 105) are final gate structures for the transistor devices. In the situation where transistor devices are manufactured using so-called gate-last processing techniques, the gate structures (gate electrode 106 and gate insulation layer 105) are sacrificial in nature and will be subsequently removed (after several process operations are performed) and replaced with a final gate structure for the device. In the gate-last processing technique, the final gate structure typically includes one or more layers of high-k (k greater than 10) insulating material and one or more layers of metal that constitute at least part of the conductive gate electrode of the final gate structure.

Figure 1C:
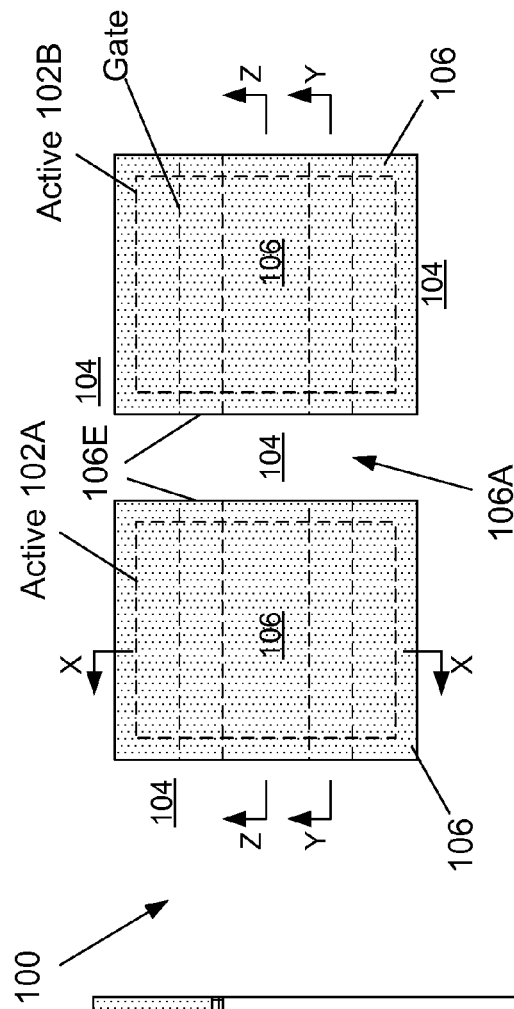
Figure 1C:
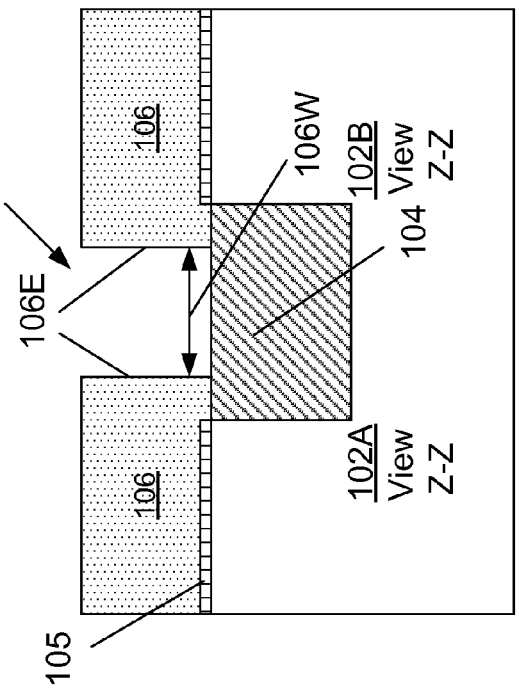
Figure 1C:
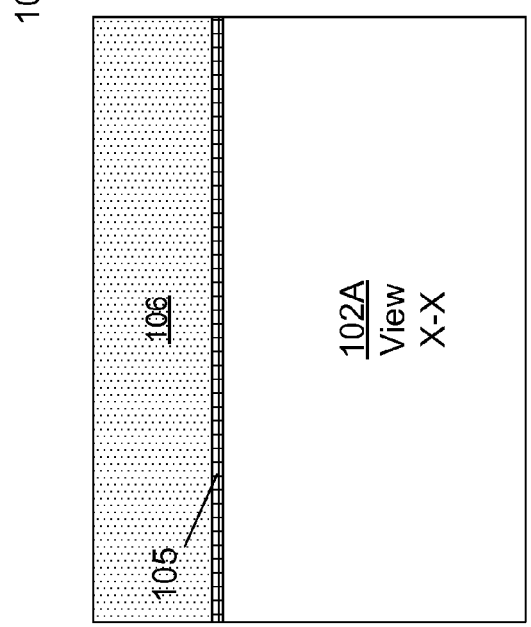
Figure 1C:
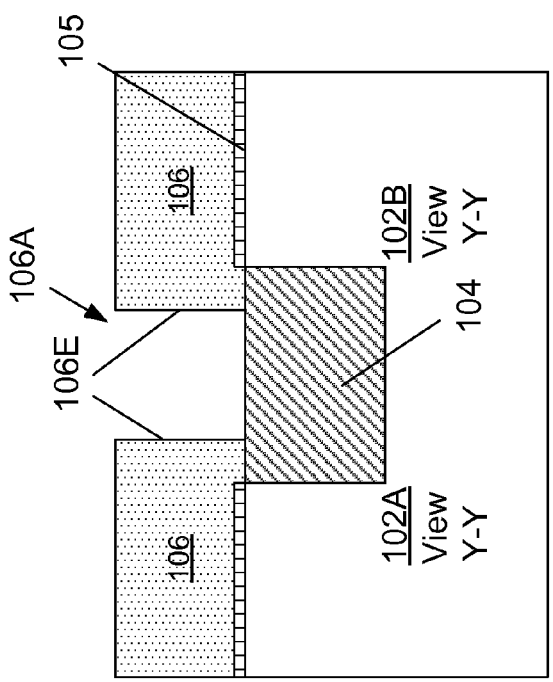

FIG. 1C depicts the product 100 after the layer of gate electrode material 106 has been patterned to define an opening 106A that is positioned above the isolation material 104. The width 106W of the opening 106A may vary depending upon the particular application, e.g., 30 nm or greater in one embodiment. The patterning of the layer of gate electrode material 106 may be accomplished by performing one or more etching processes, e.g., dry or wet, through a patterned mask layer (not shown), e.g., a photoresist mask, that is formed above the layer of gate electrode material 106. Using this process flow, the layer of gate electrode material 106 is "cut" so as to define the desired dimension of what will become the gate electrodes of the transistor devices in the "gate-width" direction of the transistor devices. This process operation effectively exposes what will become the end face surfaces 106E of the gate electrodes of the transistor devices. In one illustrative process flow, using the methods disclosed herein, the end face surfaces 106E are patterned prior to patterning the side surfaces of what will ultimately become the substantially rectangular shaped gate structures (when viewed from above) having the desired dimensions in the gate-length and gate width directions.

Figure 1D:
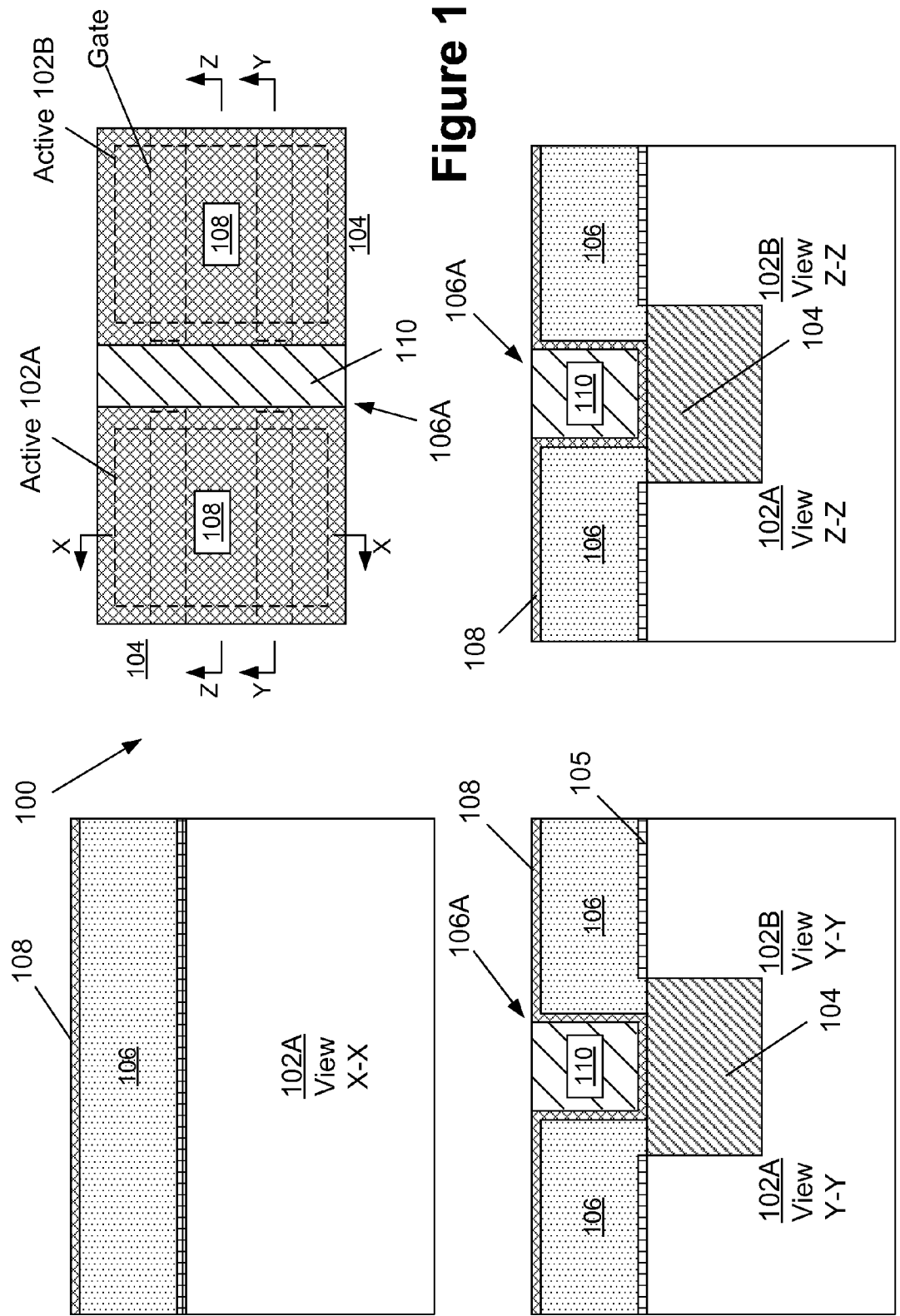

FIG. 1D depicts the product 100 after several process operations have been performed. More specifically, a line-end protection layer 108 was formed on the device and in the opening 106. Thereafter, a layer of insulating material 110 was deposited on the line-end protection layer 108 and in the opening 106. Next, a planarization process, such as a CMP process or an etch-back process, was performed using the line-end protection layer 108 as a polish-stop layer or an etch-stop layer to remove the portions of the layer of insulating material 110 positioned above the line-end protection layer 108 outside of the opening 106A. The line-end protection layer 108 may be made of a variety of materials, e.g. silicon nitride, hafnium oxide, etc., it may be formed to any desired thickness, e.g., 3-6 nm, and it may be formed by performing a conformal deposition process. The layer of insulating material 110 may be comprised of a variety of different materials as well, e.g., silicon dioxide, and it may be formed using a CVD process.

Figure 1E:
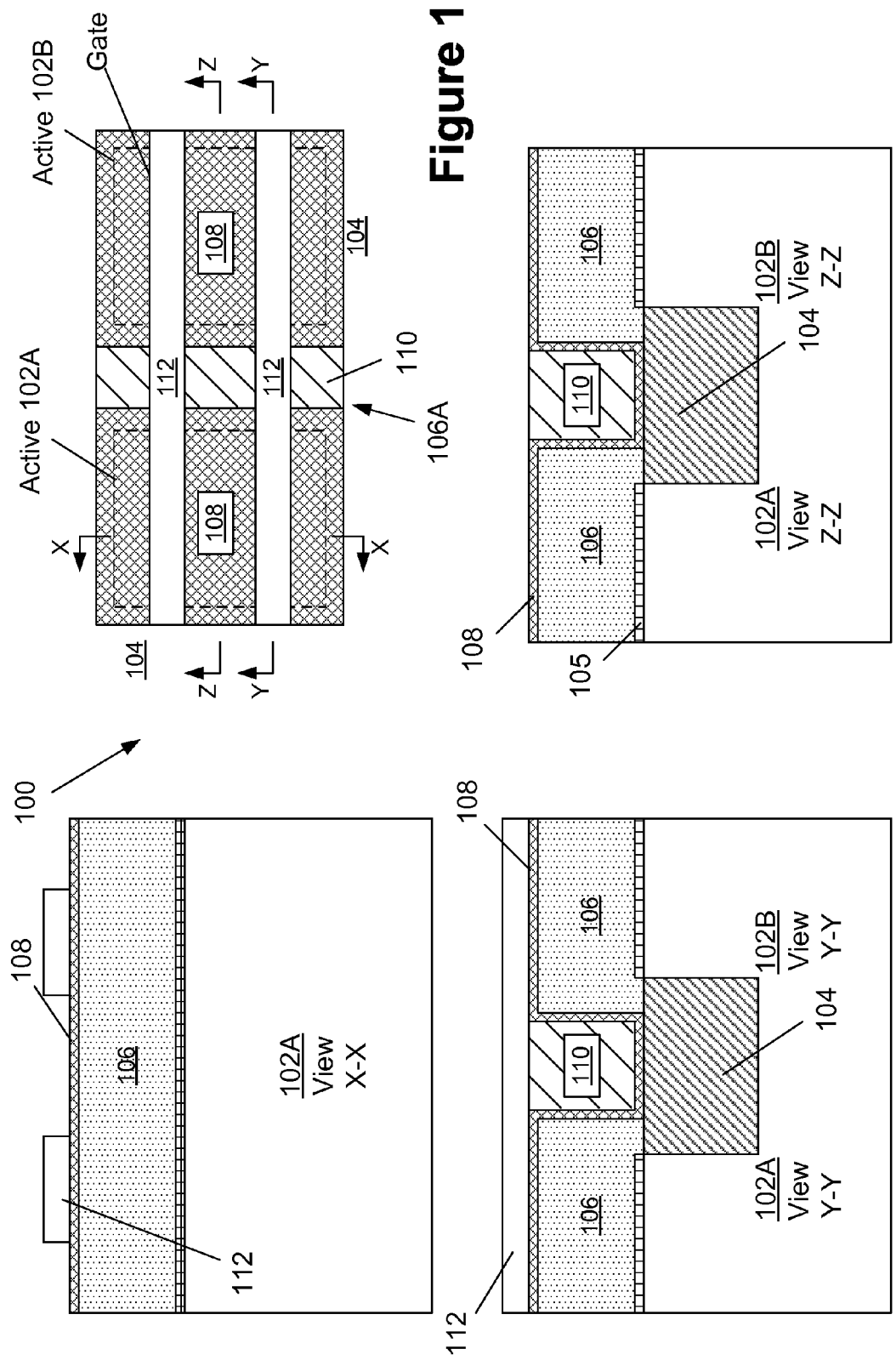

FIG. 1E depicts the product 100 after a patterned gate cap layer 112 has been formed in preparation for further patterning so as to ultimately define the substantially rectangular shaped gate structures (when viewed from above). The patterned gate cap layer 112 may be comprised of a variety of different materials, e.g., silicon nitride. The patterned gate cap layer 112 may be formed by blanket-depositing a layer of the gate cap material above the gate electrode material 106, forming a patterned photoresist etch mask (not shown) above the layer of gate cap material, and then performing one or more etching processes, e.g., an anisotropic RIE process, through the patterned photoresist etch mask. Thereafter, the patterned photoresist etch mask is removed so as to result in the structure depicted in FIG. 1E.

Figure 1F:
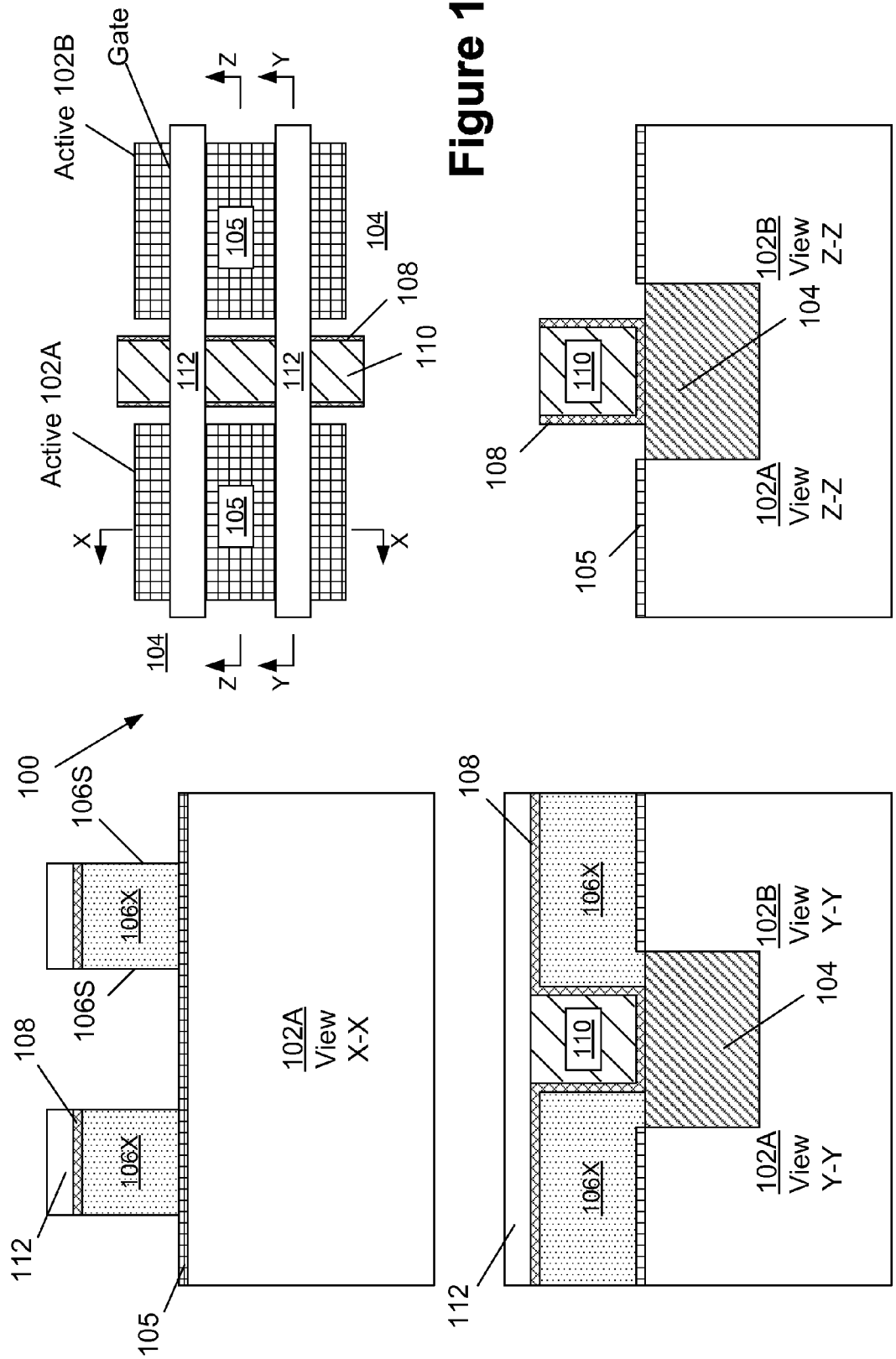

FIG. 1F depicts the product 100 after one or more etching processes have been performed to pattern the line-end protection layer 108 and the layer of gate electrode material 106 using the patterned gate cap layer 112 as an etch mask. In one illustrative embodiment, the gate insulation layer 105 is used as an etch-stop layer at this point in the process operation. This etching process effectively defines the substantially rectangular shaped gate electrode structures 106X (when viewed from above). More specifically, this etching of the layer of gate electrode material 106 results in the definition of the side surfaces 106S of the gate electrode structures 106X which result in the gate electrode structures 106X having the desired dimension in the gate-length (current transport) direction. After the gate electrodes are patterned, a sidewall spacer is typically formed around the perimeter of the substantially rectangular shaped gate structure, i.e., the spacer is formed adjacent all four sidewalls (two sidewalls and two end surfaces) of each of the patterned gate electrodes.

As shown in FIG. 1G, after the gate electrode structures 106X are completely patterned, a sidewall spacer 116 is formed along the sidewalls 106S of the gate electrode structures 106X. Importantly, using the methods and structures disclosed herein, the spacer 116 in not formed on the end face surfaces 106E of the gate electrode structures 106X since they remain covered by the line-end protection layer 108. The sidewall spacer 116 may be formed by depositing a layer of spacer material, e.g., silicon nitride, and thereafter performing an anisotropic etching process on the layer of spacer material so as to result in the spacers 116 depicted in the FIG. 1G. The base thickness or width of the spacers 116 may vary depending upon the particular application, e.g., 5-15 nm. During the formation of the spacers 116, the gate insulation layer 105 serves as an etch mask to protect the surface of the active regions 102A, 102B. As shown in FIG. 1G, after the spacers 116 are formed, an etching process may be performed to remove the exposed portions of the gate insulation layer 105.

Figure 1H:
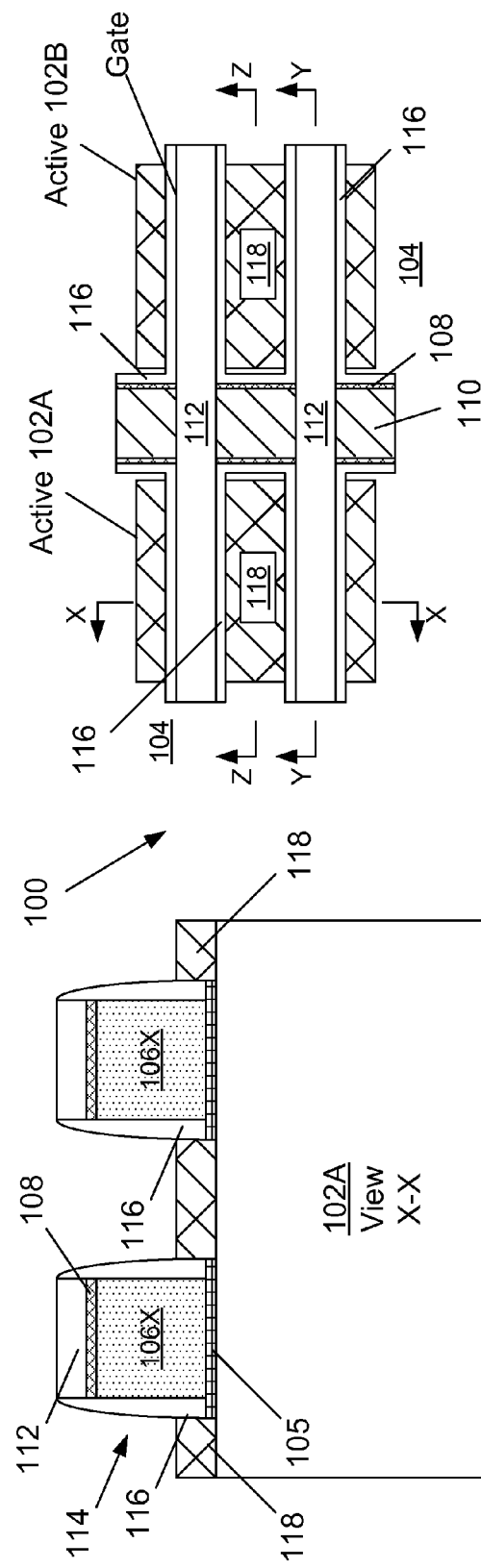
Figure 1H:
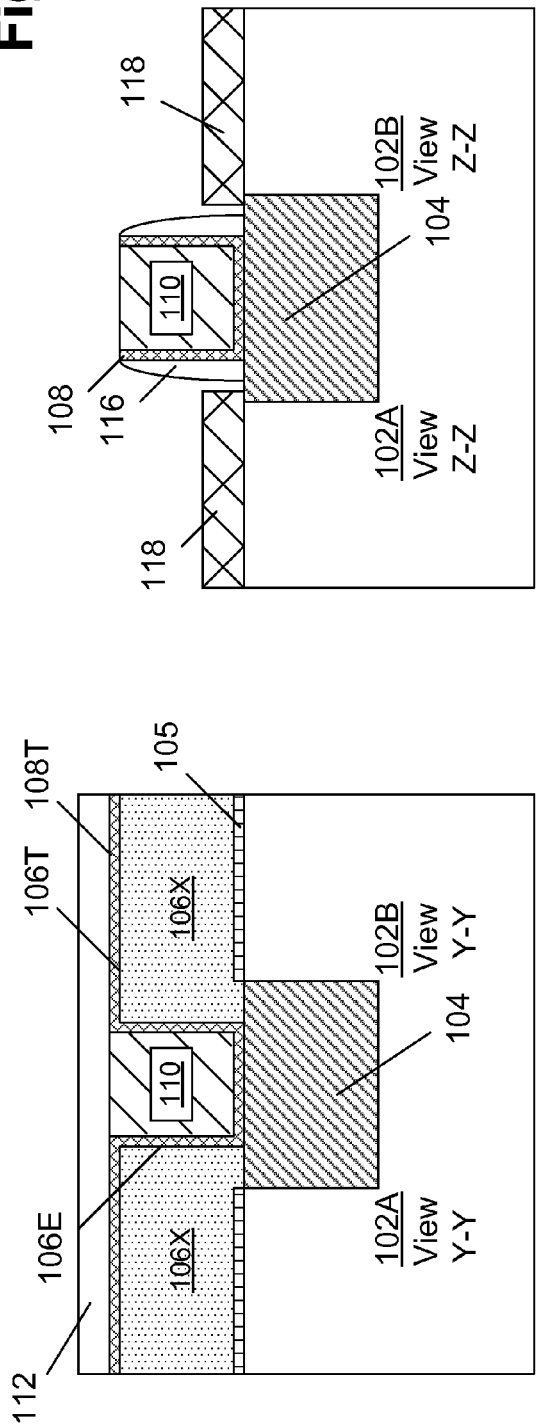

Next, as shown in FIG. 1H, if desired, an epi semiconductor material 118, e.g., silicon, silicon/germanium, was formed on the exposed portions of active regions 102A, 102B positioned outside of the spacers 116. Note that, due to the presence of the line-end protection layer 108 that contacts the end face surfaces 106E of the gate electrode structures 106X, epi semiconductor material 118 is prevented from forming around the end face surfaces 106E of the gate electrode structures 106X, thereby reducing or eliminating the chance for undesirable bridging between the source/drain regions of the devices shown in the drawings.

Figure 1I:
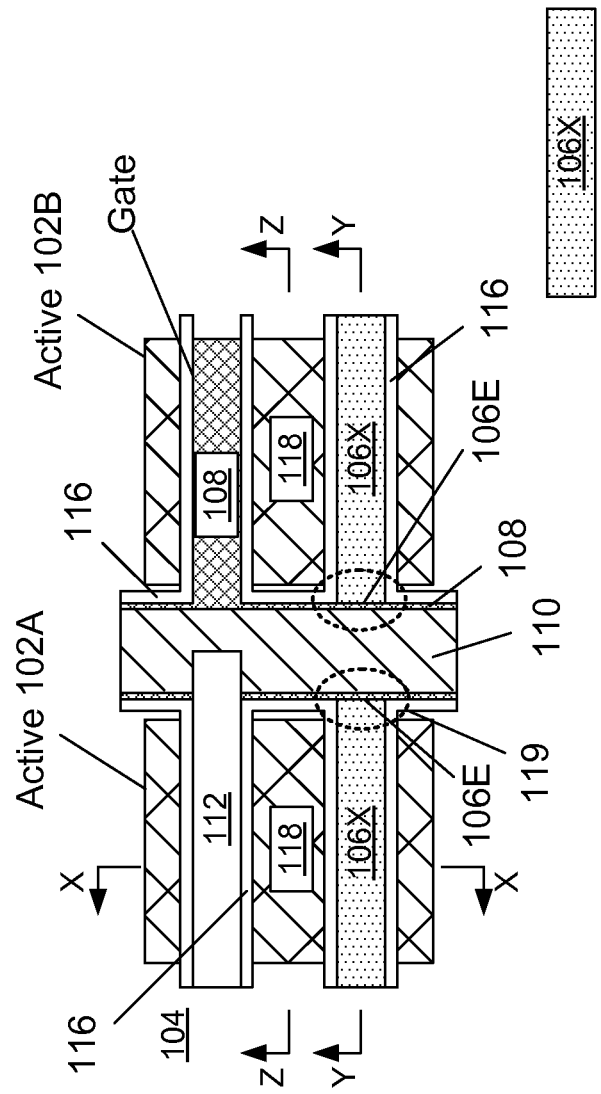

FIG. 1I is a plan view of the product which is provided in an effort to further explain the novel structures depicted herein. In FIG. 1I, the patterned gate cap layer 112 and the line-end protection layer 108 have been removed from above the upper surface of the two lowermost gate electrode structures 106X. As can be seen within the dashed lines 119, the end face surfaces 106E of the opposing gate electrode structures 106X abut the line-end protection layer 108. With continuing reference to FIG. 1I, the patterned gate cap layer 112 has been removed from above the line-end protection layer 108 depicted in the upper right corner of this drawing. As can be seen, the line-end protection layer 108 is positioned above the upper surface of the gate electrode structure 106X below the patterned gate cap layer 112. As noted above, due to the presence of the line-end protection layer 108 that contacts the end face surfaces 106E of the gate electrode structures 106X, epi semiconductor material 118 is prevented from forming around the end face surfaces 106E of the gate electrode structures 106X, thereby reducing or eliminating the chance for undesirable bridging between the source/drain regions of the devices shown in the drawings.

With reference to FIGS. 1H-1I, another point worth noting is the unique structure disclosed herein when looking at a single gate electrode structure 106X. More specifically, the line-end protection layer 108 is formed on the upper surface 106T and on both of the end face surfaces 106E of the gate electrode structure 106X, but not on the sidewalls 106S (see FIG. 1F) of the gate electrode structure 106X. Additionally, the patterned gate cap layer 112 is formed on the upper surface 108T of the line-end protection layer 108. The spacers 116 are formed adjacent, i.e., on or near, the sidewalls 106S of the gate electrode structure 106X. That is, if a liner layer is present, the spacers 116 may be formed on the liner layer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A transistor device, comprising:
   first and second spaced-apart active regions of a semiconductor substrate;
   first and second spaced-apart gate electrode structures positioned above said first and second active regions, respectively, said first and second gate electrode structures comprising opposing first and second end face surfaces, respectively;
   a line-end protection layer positioned on and in contact with an entirety of said opposing first and second end face surfaces and positioned on an upper surface of each of said first and second gate electrode structures;
   a gate cap protection layer positioned on and in contact with said line-end protection layer positioned on said upper surface of each of said first and second gate electrode structures; and
   a sidewall spacer positioned adjacent said gate cap protection layer and adjacent opposing sidewall surfaces of each of said first and second spaced-apart gate electrode structures but not adjacent said opposing first and second end face surfaces having said line-end protection layer positioned thereon.

2. The device of claim 1, further comprising an insulating material positioned in a region defined by portions of said line-end protection layer that are positioned on each of said opposing first and second end face surfaces.

3. The device of claim 1, wherein said first and second spaced-apart gate electrode structures are comprised of polysilicon or amorphous silicon.

4. The device of claim 1, wherein said first and second spaced-apart gate electrode structures are final gate electrode structures for transistor devices.

5. The device of claim 1, wherein said first and second spaced-apart gate electrode structures are sacrificial gate electrode structures for transistor devices.

6. The device of claim 1, wherein said line-end protection layer is comprised of silicon nitride or hafnium oxide.

7. The device of claim 1, wherein a region between said sidewall spacer and said opposing sidewall surfaces of each of said first and second spaced-apart gate electrode structures is free of said line-end protection layer.

8. A transistor device, comprising:
   first and second spaced-apart active regions of a semiconductor substrate;
   first and second spaced-apart gate electrode structures positioned above said first and second active regions, respectively, said first and second gate electrode structures comprising opposing first and second end face surfaces, respectively;
   a line-end protection layer positioned on and in contact with an entirety of said opposing first and second end face surfaces and positioned on and in contact with an upper surface of each of said first and second gate electrode structures;
   a gate cap protection layer positioned on and in contact with said line-end protection layer positioned on said upper surface of each of said first and second gate electrode structures; and
   a sidewall spacer positioned adjacent opposing sidewall surfaces of each of said first and second spaced-apart gate electrode structures but not adjacent said opposing first and second end face surfaces having said line-end protection layer positioned thereon.

9. The device of claim 8, further comprising an insulating material positioned in a region defined by portions of said line-end protection layer that are positioned on each of said opposing first and second end face surfaces.

10. The device of claim 8, wherein said sidewall spacer is positioned adjacent said gate cap protection layer.

11. The device of claim 8, wherein said line-end protection layer is comprised of silicon nitride or hafnium oxide.

12. The device of claim 10, wherein a region between said sidewall spacer and said opposing sidewall surfaces of each of said first and second spaced-apart gate electrode structures is free of said line-end protection layer.

13. A transistor device, comprising:
   first and second spaced-apart active regions of a semiconductor substrate;
   first and second spaced-apart gate electrode structures positioned above said first and second active regions, respectively, said first and second gate electrode structures comprising opposing first and second end face surfaces, respectively;
   a line-end protection layer positioned on and in contact with an entirety of said opposing first and second end face surfaces and positioned on and in contact with an upper surface of each of said first and second gate electrode structures;
   a gate cap protection layer positioned on and in contact with said line-end protection layer positioned on said upper surface of each of said first and second gate electrode structures;
   a sidewall spacer positioned adjacent opposing sidewall surfaces of each of said first and second spaced-apart gate electrode structures but not adjacent said opposing first and second end face surfaces having said line-end protection layer positioned thereon, wherein a region between said sidewall spacer and said opposing sidewall surfaces of each of said first and second spaced-apart gate electrode structures is free of said line-end protection layer; and
   an insulating material positioned in a region defined by portions of said line-end protection layer that are positioned on each of said opposing first and second end face surfaces.

14. The device of claim 13, wherein said sidewall spacer is positioned adjacent said gate cap protection layer.

15. The device of claim 14, wherein said line-end protection layer is comprised of silicon nitride or hafnium oxide.

* * * * *